(12) United States Patent
Sasagawa et al.

(10) Patent No.: US 11,810,791 B2
(45) Date of Patent: Nov. 7, 2023

(54) ETCHING METHOD, SUBSTRATE PROCESSING APPARATUS, AND SUBSTRATE PROCESSING SYSTEM

(71) Applicant: TOKYO ELECTRON LIMITED, Tokyo (JP)

(72) Inventors: Hironari Sasagawa, Miyagi (JP); Maju Tomura, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/160,460

(22) Filed: Jan. 28, 2021

(65) Prior Publication Data

US 2021/0233777 A1    Jul. 29, 2021

(30) Foreign Application Priority Data

Jan. 29, 2020  (JP) ................................ 2020-012241

(51) Int. Cl.
| | |
|---|---|
| *H01L 21/311* | (2006.01) |
| *H01L 21/3065* | (2006.01) |
| *H01J 37/32* | (2006.01) |
| *H01L 21/02* | (2006.01) |
| *H01L 21/308* | (2006.01) |
| *H01L 21/3213* | (2006.01) |

(52) U.S. Cl.
CPC .. *H01L 21/31116* (2013.01); *H01J 37/32082* (2013.01); *H01J 37/32449* (2013.01); *H01L 21/02164* (2013.01); *H01L 21/308* (2013.01); *H01L 21/3065* (2013.01); *H01L 21/31144* (2013.01); *H01L 21/32136* (2013.01); *H01L 21/32139* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 9,543,148 B1* | 1/2017 | Hudson | ............ H01L 21/67069 |
| 10,529,582 B2 | 1/2020 | Horiuchi | |
| 2017/0178920 A1* | 6/2017 | Dole | ................ H01L 21/31116 |

FOREIGN PATENT DOCUMENTS

| | | |
|---|---|---|
| JP | 2014-225501 A | 12/2014 |
| JP | 2019-050305 A | 3/2019 |

* cited by examiner

*Primary Examiner* — Stephanie P Duclair
(74) *Attorney, Agent, or Firm* — WEIHROUCH IP

(57) ABSTRACT

An etching method includes forming a film on a surface of a substrate. The substrate has a region at least partially made of silicon oxide and a mask. The mask is provided on the region and includes an opening that partially exposes the region. The film is made of the same material as that of the region. The film is formed to correct a shape of a side wall defining the opening to a vertical shape. The etching method further includes etching the region.

19 Claims, 8 Drawing Sheets

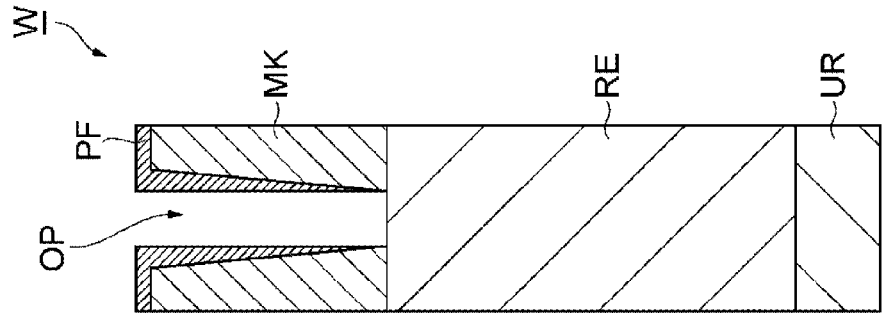
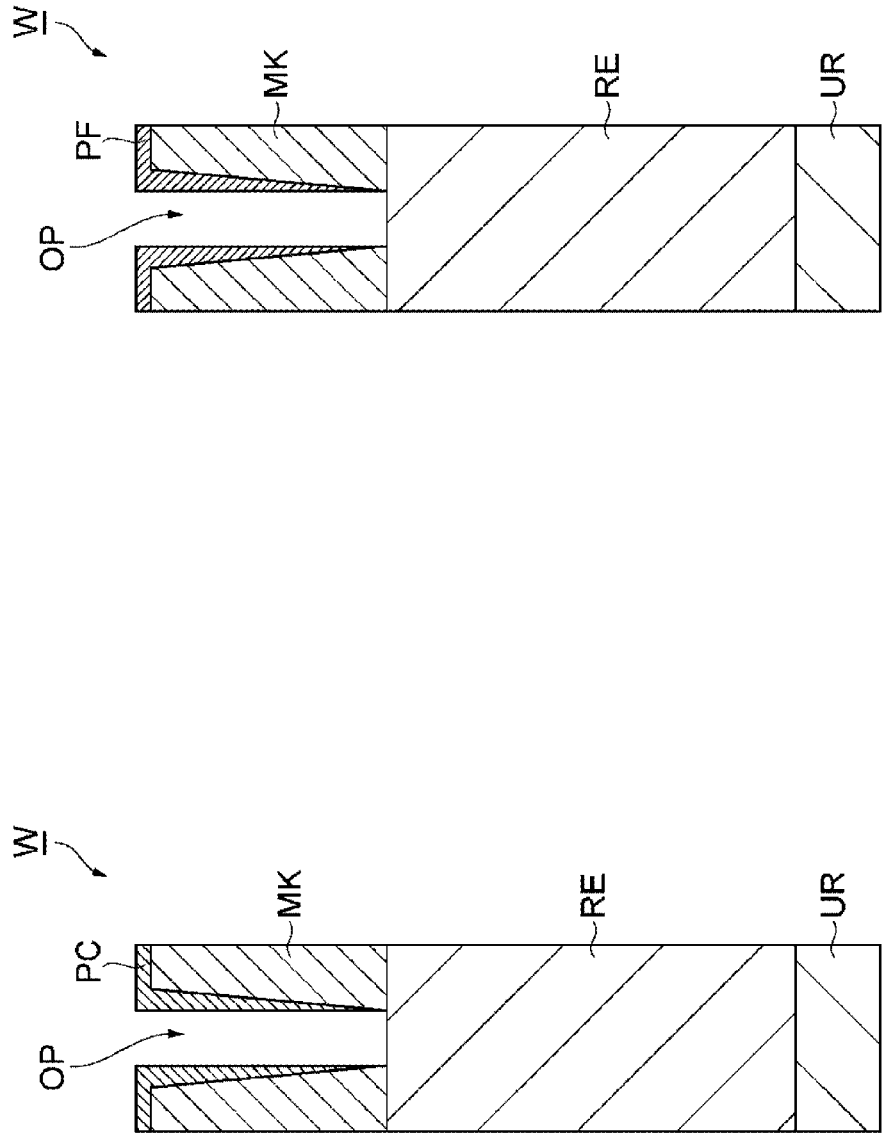

ETCHING METHOD, SUBSTRATE PROCESSING APPARATUS, AND SUBSTRATE PROCESSING SYSTEM

CROSS-REFERENCE TO RELATED APPLICATIONS

This application is based on and claims priority from Japanese Patent Application No. 2020-012241 filed on Jan. 29, 2020 with the Japan Patent Office, the disclosure of which is incorporated herein in its entirety by reference.

TECHNICAL FIELD

Exemplary embodiments disclosed herein relate to an etching method, a substrate processing apparatus, and a substrate processing system.

BACKGROUND

Plasma etching is used to form an opening in a film formed on a substrate. Japanese Patent Laid-Open Publication No. 2019-050305 discloses plasma etching of a silicon oxide film. The silicon oxide film is etched by chemical species from plasma generated from a fluorocarbon gas. During the etching of the silicon oxide film, fluorocarbon is deposited on the side wall surface defining an opening, so that the lateral etching of the silicon oxide film is suppressed.

SUMMARY

In an exemplary embodiment, an etching method is provided. The etching method includes forming a film on a surface of a substrate. The substrate has a region at least partially made of silicon oxide and a mask. The mask is provided on the region of the substrate and includes an opening that partially exposes the region. The film is made of the same material as that of the region of the substrate. The etching method further includes etching the region of the substrate. In the etching, the film corrects a shape of the mask to enhance a verticality of the opening formed in the region.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6A is a partially enlarged cross-sectional view of the exemplary substrate after a precursor layer is formed, and FIG. 6B is a partially enlarged cross-sectional view of the exemplary substrate after a film PF is formed.

DETAILED DESCRIPTION

Figure 1:
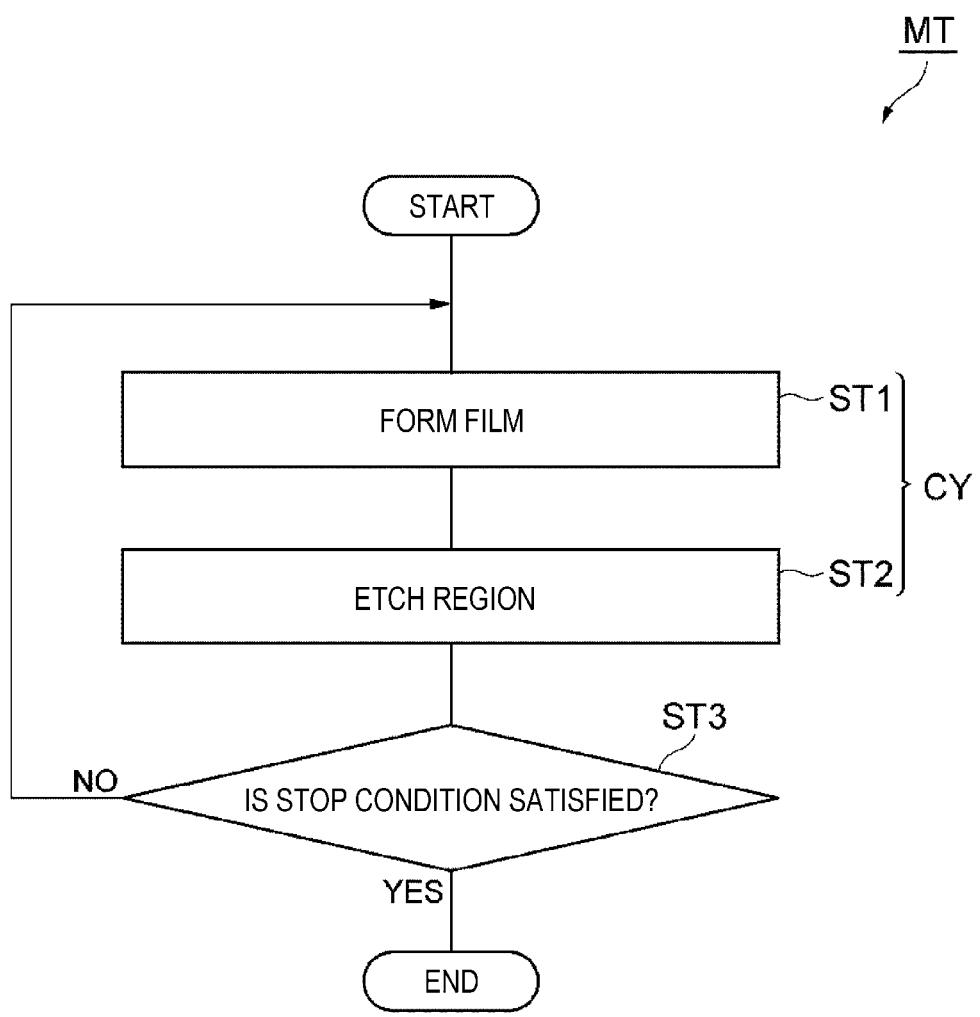
FIG. 1 is a flowchart illustrating an etching method according to an embodiment.

In the following detailed description, reference is made to the accompanying drawing, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In an embodiment, an etching method is provided. The etching method includes a step of forming a film on a surface of a substrate. The substrate has a region at least partially made of silicon oxide and a mask. The mask is provided on the region of the substrate and includes an opening that partially exposes the region. The film is made of the same material as that of the region of the substrate. The etching method further includes a step of etching the region of the substrate. The film corrects a shape of the mask to enhance a verticality of the opening formed in the region in the etching.

In the etching method of the embodiment, the film formed on the substrate protects the mask at the beginning of etching the region. Therefore, according to the etching method of the embodiment, the selectivity of etching the region of the substrate with respect to the etching of the mask may be enhanced. Further, since the shape of the mask is corrected by the film, the verticality of the opening formed in the region by etching is enhanced.

In an exemplary embodiment, the film may be formed such that a thickness thereof decreases from an upper end of the substrate along a depth direction of the opening.

In an embodiment, the step of forming the film and the step of etching the region are alternately repeated.

In an embodiment, the step of forming the film may include supplying a first gas to the substrate thereby forming a precursor layer on the substrate; and supplying a second gas to the precursor layer thereby forming the film from the precursor layer.

In an embodiment, the region of the substrate may include a silicon oxide film. In an embodiment, the region of the substrate may include one or more silicon oxide films and one or more silicon nitride films that are alternately stacked. In an embodiment, the region of the substrate may include one or more silicon oxide films and one or more polycrystalline silicon films that are alternately stacked. In an embodiment, the region of the substrate may include one or more silicon oxide films, one or more silicon nitride films, and one or more polycrystalline silicon films that are stacked.

In an embodiment, the mask may be made of silicon, a carbon-containing material, or metal-containing material.

In another embodiment, a substrate processing apparatus is provided. The substrate processing apparatus includes a chamber, a gas supply, and a controller. The gas supply unit is configured to supply a gas into the chamber. The controller controls the gas supply to supply the gas into the chamber such that a film is formed on a substrate. The substrate has a region at least partially made of silicon oxide and a mask. The film is made of the same material as that of the region of the substrate. The film corrects a shape of the mask thereby enhancing a verticality of an opening formed in the region by etching. The controller controls the gas supply to supply the gas into the chamber such that the region of the substrate is etched.

In still another embodiment, a substrate processing system is provided. The substrate processing system includes a film forming apparatus and a substrate processing apparatus. The film forming apparatus is configured to form a film on a substrate. The substrate has a region at least partially made of silicon oxide and a mask. The film is made of the same material as that of the region of the substrate. The film corrects a shape of the mask thereby enhancing a verticality of an opening formed in the region by etching. The substrate processing apparatus is configured to etch the region of the substrate.

Hereinafter, various embodiments will be described in detail with reference to the drawings. Meanwhile, in the respective drawings, the same or corresponding parts will be denoted by the same symbols.

Figure 2:
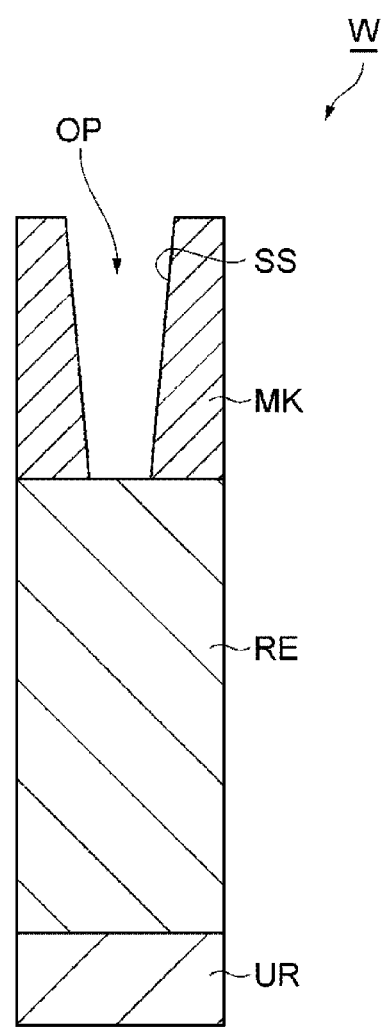
FIG. 2 is a partially enlarged cross-sectional view illustrating an exemplary substrate.

FIG. 1 is a flowchart illustrating an etching method according to an embodiment. The etching method illustrated in FIG. 1 (hereinafter, referred to as a "method MT") is performed to etch a region in a substrate. FIG. 2 is a partially enlarged cross-sectional view illustrating an exemplary substrate. The substrate W illustrated in FIG. 2 includes a region RE and a mask MK. The substrate W may further include an underlying region UR.

The region RE is a region to be etched by the method MT. In the substrate W illustrated in FIG. 2, the region RE is provided on the underlying region UR. The mask MK is provided on the region RE. The mask MK is patterned. That is, the mask MK provides one or more openings OP that partially expose the region RE. The width of the opening OP provided by the mask MK may be, for example, 100 nm or less.

The region RE is at least partially made of silicon oxide. In a first example of the substrate W, the region RE may include a silicon oxide film. In the first example of the substrate W, the region RE may include a single silicon oxide film. In a second example of the substrate W, the region RE may include one or more silicon oxide films and one or more silicon nitride films which are alternately stacked. In the second example of the substrate W, the region RE may include a single silicon oxide film and a single silicon nitride film. The single silicon nitride film may be provided between the single silicon oxide film and the mask MK. In a third example of the substrate W, the region RE may include one or more silicon oxide films and one or more polycrystalline silicon films which are alternately stacked. In a fourth example of the substrate W, the region RE may include one or more silicon oxide films, one or more silicon nitride films, and one or more polycrystalline silicon films which are stacked.

The mask MK may be made of any material as long as the region RE is selectively etched with respect to the mask MK in step ST2 described later. The mask MK may be made of silicon, a carbon-containing material, or a metal-containing material. The silicon contained in the mask MK is, for example, polycrystalline silicon or amorphous silicon. The carbon-containing material contained in the mask MK is, for example, amorphous carbon or a spin-on-carbon material. The metal-containing material contained in the mask MK is, for example, tungsten, tungsten carbide, or titanium nitride.

Figure 3:
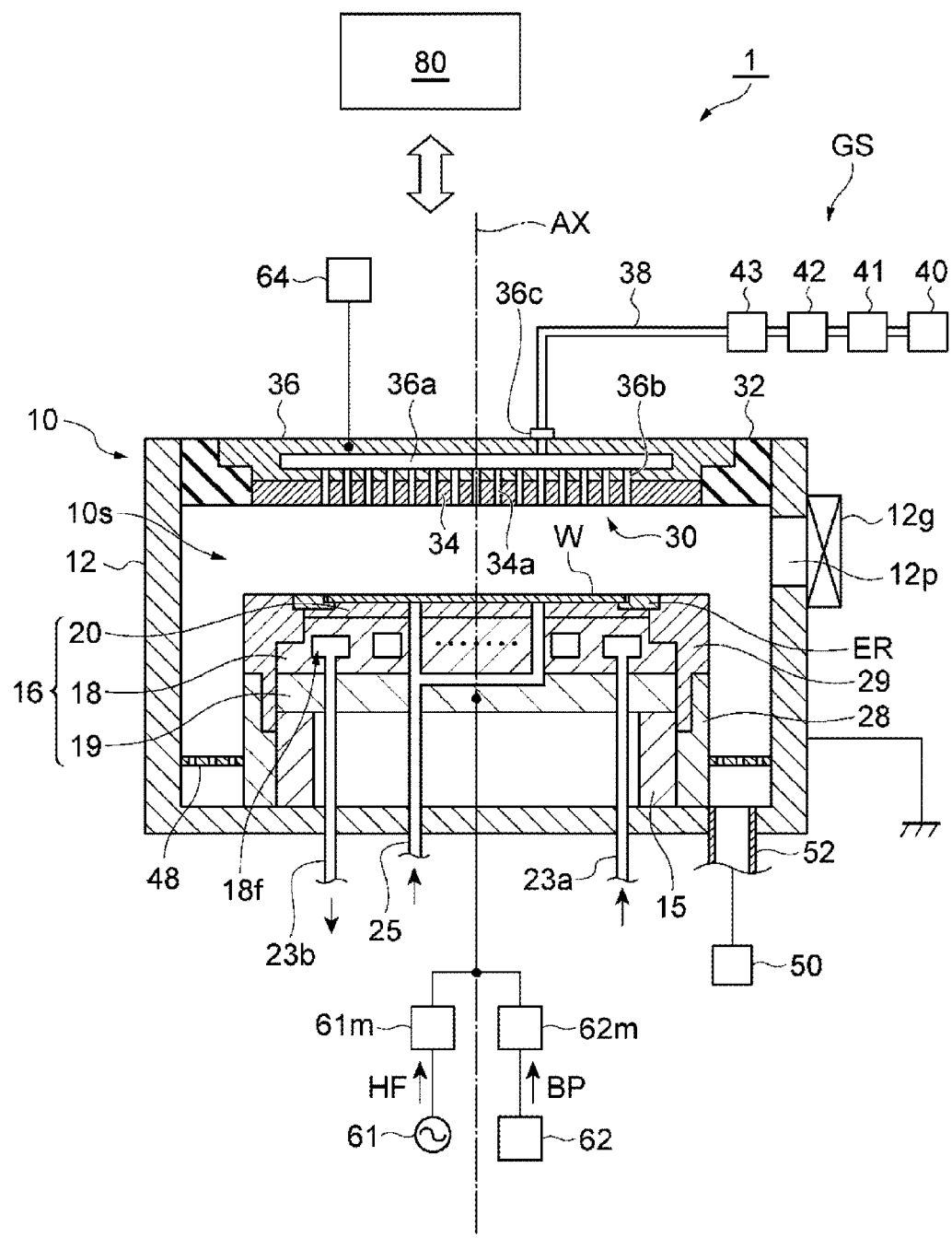
FIG. 3 is a schematic view illustrating a substrate processing apparatus according to an embodiment.

In an embodiment, the method MT is performed using a substrate processing apparatus. FIG. 3 is a schematic view illustrating a substrate processing apparatus according to an embodiment. The substrate processing apparatus illustrated in FIG. 3 is a capacitively coupled plasma processing apparatus 1.

The plasma processing apparatus 1 includes a chamber 10. The chamber 10 provided an internal space 10s therein. The central axis of the chamber 10 is an axis AX that extends in the vertical direction. In the embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having corrosion resistance is provided on an inner wall surface of the chamber body 12. The film having corrosion resistance may be a film made of a ceramic such as aluminum oxide or yttrium oxide.

A passage 12p is formed at a side wall of the chamber body 12. The substrate W passes through the passage 12p when being transferred between the internal space 10s and the outside of the chamber 10. The passage 12p is openable/closable by a gate valve 12g. The gate valve 12g is provided along the side wall of the chamber body 12.

The plasma processing apparatus 1 further includes a substrate supporter 16. The substrate supporter 16 is configured to support the substrate W in the chamber 10. The substrate W has a substantially disc shape. The substrate supporter 16 is supported by a support 15. The support 15 extends upward from the bottom of the chamber body 12. The support 15 has a substantially cylindrical shape. The support 15 is made of an insulating material such as quartz.

The substrate supporter 16 includes a lower electrode 18 and an electrostatic chuck 20. The substrate supporter 16 may further include an electrode plate 19. The electrode plate 19 is made of a conductive material such as aluminum. The electrode plate 19 has a substantially disc shape, and the central axis thereof is the axis AX. The lower electrode 18 is provided on the electrode plate 19. The lower electrode 18 is made of a conductive material such as aluminum. The lower electrode 18 has a substantially disc shape, and the central axis thereof is the axis AX. The lower electrode 18 is electrically connected to the electrode plate 19.

A flow path 18f is provided in the lower electrode 18. The flow path 18f is a flow path for a heat exchange medium (e.g., coolant). The flow path 18f is connected with a heat exchange medium supply device (e.g., chiller unit). The supply device is provided outside the chamber 10. A heat exchange medium is supplied from the supply device to the flow path 18f through a pipe 23a. The heat exchange medium supplied to the flow path 18f returns to the supply device through a pipe 23b. The heat exchange medium supply device constitutes a temperature control mechanism of the plasma processing apparatus 1.

Figure 4:
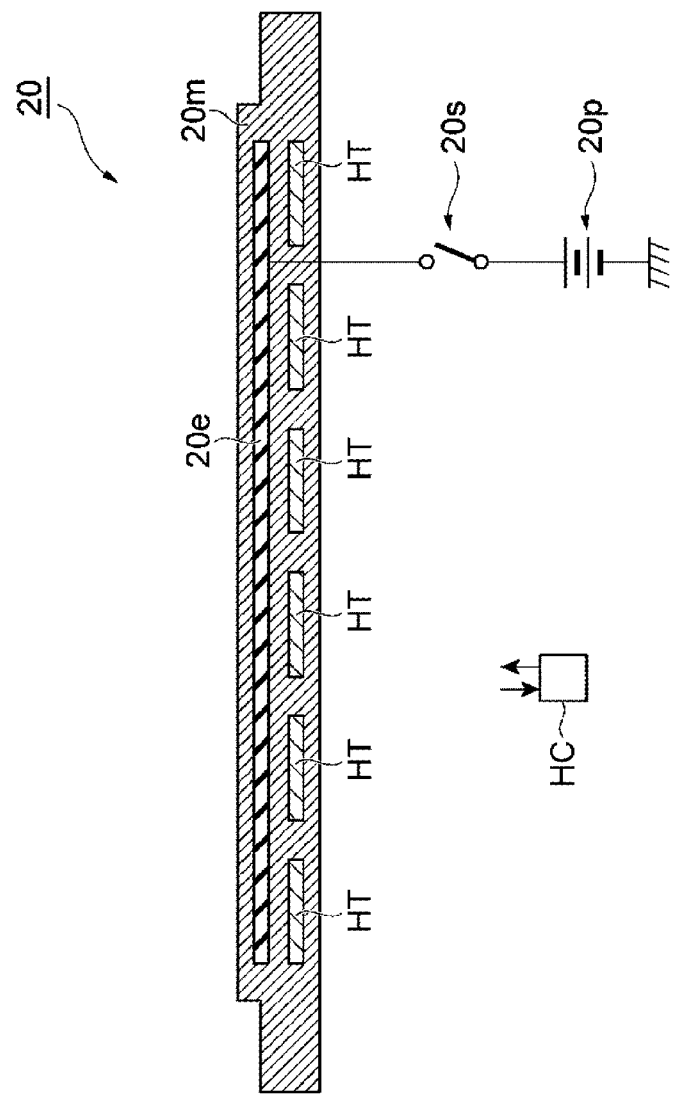
FIG. 4 is an enlarged cross-sectional view of an electrostatic chuck in the substrate processing apparatus according to the embodiment.

FIG. 4 is an enlarged cross-sectional view of an electrostatic chuck in the substrate processing apparatus according to the embodiment. Hereinafter, reference will be made to FIGS. 3 and 4. The electrostatic chuck 20 is provided on the lower electrode 18. The substrate W is placed on the upper surface of the electrostatic chuck 20. The electrostatic chuck 20 has a body 20m and an electrode 20e. The body 20m is made of a dielectric. The electrostatic chuck 20 and the body 20m have a substantially disc shape, and the central axes thereof coincide with the axis AX. The electrode 20e is a film-shaped electrode and provided in the body 20m. The electrode 20e is connected to a DC power supply 20p via a switch 20s. When a voltage is applied from the DC power supply 20p to the electrode 20e, an electrostatic attractive force is generated between the electrostatic chuck 20 and the substrate W. Due to the generated electrostatic attractive force, the substrate W is attracted to the electrostatic chuck 20 and held by the electrostatic chuck 20.

The substrate supporter 16 may include one or more heaters HT. Each of the one or more heaters HT may be a resistance heating element. The plasma processing apparatus 1 may further include a heater controller HC. Each of the one or more heaters HT generates heat according to the electric power individually applied from the heater controller HC. As a result, the temperature of the substrate W on the substrate supporter 16 is adjusted. The one or more heaters HT constitute a temperature control mechanism of the plasma processing apparatus 1. In an embodiment, the substrate supporter 16 includes a plurality of heaters HT. The plurality of heaters HT may be provided in the electrostatic chuck 20.

An edge ring ER is disposed on a periphery of the substrate supporter 16 to surround an edge of the substrate W. The substrate W is disposed on the electrostatic chuck 20 and in a region surrounded by the edge ring ER. The edge ring ER is used to improve the in-plane uniformity of the plasma processing on the substrate W. The edge ring ER may be made of silicon, silicon carbide, or quartz.

The plasma processing apparatus 1 may further include a gas supply line 25. The gas supply line 25 supplies a heat transfer gas (e.g., He gas) from a gas supply mechanism to a gap between the upper surface of the electrostatic chuck 20 and the rear surface (lower surface) of the substrate W.

The plasma processing apparatus 1 may further include a cylindrical portion 28 and an insulating portion 29. The cylindrical portion 28 extends upward from the bottom of the chamber body 12. The cylindrical portion 28 extends along the outer periphery of the support 15. The cylindrical portion 28 is made of a conductive material and has a substantially cylindrical shape. The cylindrical portion 28 is electrically grounded. The insulating portion 29 is provided on the cylindrical portion 28. The insulating portion 29 is made of an insulating material. The insulating portion 29 is made of a ceramic such as, for example, quartz. The insulating portion 29 has a substantially cylindrical shape. The insulating portion 29 extends along the outer periphery of the electrode plate 19, the outer periphery of the lower electrode 18, and the outer periphery of the electrostatic chuck 20.

The plasma processing apparatus 1 further includes an upper electrode 30. The upper electrode 30 is provided above the substrate supporter 16. The upper electrode 30 is supported in the upper portion of the chamber body 12 through a member 32. The member 32 is made of an insulating material. The upper electrode 30 and the member 32 close the upper opening of the chamber body 12.

The upper electrode 30 may include a top plate 34 and a support 36. The lower surface of the top plate 34 is a lower surface on the internal space 10s side, and defines the internal space 10s. The top plate 34 may be made of a low-resistance conductor or a semiconductor that generates low Joule heat. In an embodiment, the top plate 34 is made of silicon. A plurality of gas ejection holes 34a are formed in the top plate 34. The plurality of gas ejection holes 34a penetrate the top plate 34 in the plate thickness direction.

The support 36 detachably supports the top plate 34. The support 36 is made of a conductive material such as aluminum. A gas diffusion chamber 36a is provided inside the support 36. A plurality of gas holes 36b are formed in the support body 36. The plurality of gas holes 36b extend downward from the gas diffusion chamber 36a. The plurality of gas holes 36b communicate with the plurality of gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

The gas supply pipe 38 is connected with a gas source group 40 via a valve group 41, a flow rate controller group 42, and a valve group 43. The gas source group 40, the valve group 41, the flow rate controller group 42, and the valve group 43 constitute a gas supply GS. The gas source group 40 includes a plurality of gas sources. The plurality of gas sources of the gas source group 40 include a plurality of gas sources which are used in the method MT. When one or more gases used in the method MT are formed from liquid, the plurality of gas sources includes one or more gas sources each having a liquid source and a vaporizer. Each of the valve group 41 and the valve group 43 includes a plurality of opening/closing valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through the opening/closing valves corresponding to the valve group 41, the flow rate controllers corresponding to the flow rate controller group 42, and the opening/closing valves corresponding to the valve group 43.

The plasma processing apparatus 1 may further include a baffle member 48. The baffle member 48 is provided between the cylindrical portion 28 and a side wall of the chamber body 12. The baffle member 48 may be a plate-shaped member. The baffle plate 48 is formed by, for example, forming a corrosion-resistant film on the surface of a member made of aluminum. The corrosion-resistant film may be a film made of a ceramic such as yttrium oxide. The baffle member 48 has a plurality of through-holes formed therein. An exhaust port 12e is provided at the lower side of the baffle member 48 and at the bottom of the chamber body 12. The exhaust port 12e is connected with an exhaust device 50 through an exhaust pipe 52. The exhaust device 50 includes a pressure regulation valve and a vacuum pump such as a turbo molecular pump.

The plasma processing apparatus 1 further includes a radio-frequency power supply 61. The radio-frequency power supply 61 generates a radio-frequency power HF for plasma generation. The radio-frequency power HF has a first frequency. The first frequency is, for example, a frequency within a range of 27 MHz to 100 MHz. The radio-frequency power supply 61 is connected to the lower electrode 18 through a matcher 61m and the electrode plate 19 to supply the radio-frequency power HF to the lower electrode 18. The matcher 61m includes a matching circuit. The matching circuit of the matcher 61m has a variable impedance. The impedance of the matching circuit of the matcher 61m is adjusted so as to reduce the reflection from the load of the radio-frequency power supply 61. The radio-frequency power supply 61 may not be electrically connected to the lower electrode 18, and may be connected to the upper electrode 30 through the matcher 61m. The radio-frequency power supply 61 constitutes an exemplary plasma generator.

The plasma processing apparatus 1 further includes a bias power supply 62. The bias power supply 62 generates a bias power BP which is used for drawing ions into the substrate W. The bias power supply 62 is connected to the lower electrode 18 via the electrode plate 19.

In an embodiment, the bias power supply 62 may be a radio-frequency power supply that generates a radio-frequency power LF as a bias power BP. The radio-frequency power LF has a second frequency suitable for drawing ions in the plasma into the substrate W. The second frequency may be lower than the first frequency. The second frequency is, for example, a frequency within a range of 400 kHz to 13.56 MHz. In the embodiment, the bias power supply 62 is connected to the lower electrode 18 via a matcher 62m and the electrode plate 19. The matcher 62m includes a matching circuit. The matching circuit of the matcher 62m has a variable impedance. The impedance of the matching circuit of the matcher 62m is adjusted so as to reduce the reflection from the load of the bias power supply 62.

The plasma may be generated using only one of the radio-frequency power supply 61 and the bias power supply 62. In this case, one power supply constitutes an exemplary plasma generator. In this case, the frequency of the radio-frequency power supplied from the one power supply may be a frequency larger than 13.56 MHz, for example, 40 MHz. In this case, the plasma processing apparatus does not have to include another power supply of the radio-frequency power supply 61 and the bias power supply 62.

In another embodiment, the bias power supply 62 may be a DC power supply device that intermittently or periodically applies a pulse of a negative DC voltage as the bias power BP to the lower electrode 18. For example, the bias power supply 62 may periodically apply a negative DC voltage pulse to the lower electrode 18 at a cycle defined by a frequency in a range of 1 kHz to 1 MHz.

In an embodiment, the plasma processing apparatus 1 may further include a DC power supply device 64. The DC power supply device 64 is connected to the upper electrode 30. The DC power supply device 64 is configured to supply a DC voltage, for example, negative DC voltage to the upper electrode 30. The DC power supply device 64 may intermittently or periodically apply a pulse of DC voltage to the upper electrode 30.

When plasma is generated in the plasma processing apparatus 1, a gas is supplied from the gas supply GS to the internal space 10s. Further, a radio-frequency electric field is generated between the upper electrode 30 and the lower electrode 18 by supplying the radio-frequency power. The gas is excited by the generated radio-frequency electric field. As a result, plasma is generated in the chamber 10.

The plasma processing apparatus 1 further includes a controller 80. The controller 80 is a computer including, for example, a processor, a storage device, an input device, and a display device, and controls respective parts of the plasma processing apparatus 1. Specifically, the controller 80 executes a control program stored in the storage device and controls respective parts of the plasma processing apparatus 1 based on a recipe data stored in the storage device. A process designated by the recipe data is executed in the plasma processing apparatus 1 by the control of the controller 80. The method MT may be performed in the plasma processing apparatus 1 by the control of the respective parts of the plasma processing apparatus 1 by the controller 80.

Referring back to FIG. 1, the method MT will be described in detail. In the following descriptions, the method MT will be described by taking as an example the case where the substrate W illustrated in FIG. 2 is processed by using the plasma processing apparatus 1. In the method MT, another substrate processing apparatus may be used. In the method MT, another substrate may be processed.

The method MT is performed in a state where the substrate W is placed on the substrate supporter 16. The method MT may be performed while maintaining a decompressed environment in the internal space 10s of the chamber 10 and without removing the substrate W from the internal space 10s.

The method MT includes step ST1 and step ST2. In step ST1, a film PF is formed on the surface of the substrate W (see FIG. 6B). In step ST2, the region RE is etched. The film PF is made of the same material as the material of the region RE. The film PF is etched at the same time when the region RE is etched in step ST2. In an embodiment, an etching rate of the film PF in step ST2 is equal to or higher than an etching rate of the region RE. Alternatively, the value obtained by dividing the etching rate of the film PF by the etching rate of the region RE may be 0.7 or more and 1.2 or less. In an embodiment, the film PF is made of silicon oxide such as TEOS.

The film PF formed in step ST1 corrects the shape of the mask MK so as to enhance the verticality of the opening formed in the region RE in step ST2. The film PF may be formed to relax the tapered shape of the mask MK (see FIG. 2). In step ST1, as illustrated in FIG. 6B, the film PF may be formed to correct the shape of a side wall surface SS (see FIG. 2) defining the opening OP to a vertical shape. In an embodiment, the film PF is formed such that a thickness thereof decreases from an upper end of the substrate W along a depth direction of the opening OP.

The film PF may be formed by a CVD method in step ST1. The CVD method may be a plasma (plasma enhanced) CVD method, or may be a thermal CVD method. In step ST1 by the CVD method, a film-forming gas is supplied into the chamber 10. In step ST1 by the CVD method, plasma may be generated from the film-forming gas in the chamber 10. The film-forming gas further contains a silicon-containing gas and an oxygen-containing gas. The silicon-containing gas is, for example, $SiCl_4$. The oxygen-containing gas is, for example, $O_2$.

In step ST1 by the CVD method, the controller 80 controls the gas supply GS to supply the film-forming gas into the chamber 10. Further, the controller 80 controls the exhaust device 50 to set the pressure in the chamber 10 to a designated pressure. In step ST1 by the CVD method, the controller 80 may control the plasma generator to generate plasma from the film-forming gas. Specifically, the controller 80 may control the radio-frequency power supply 61 and the bias power supply 62 to supply the radio-frequency power HF and/or the radio-frequency power LF.

Figure 5:
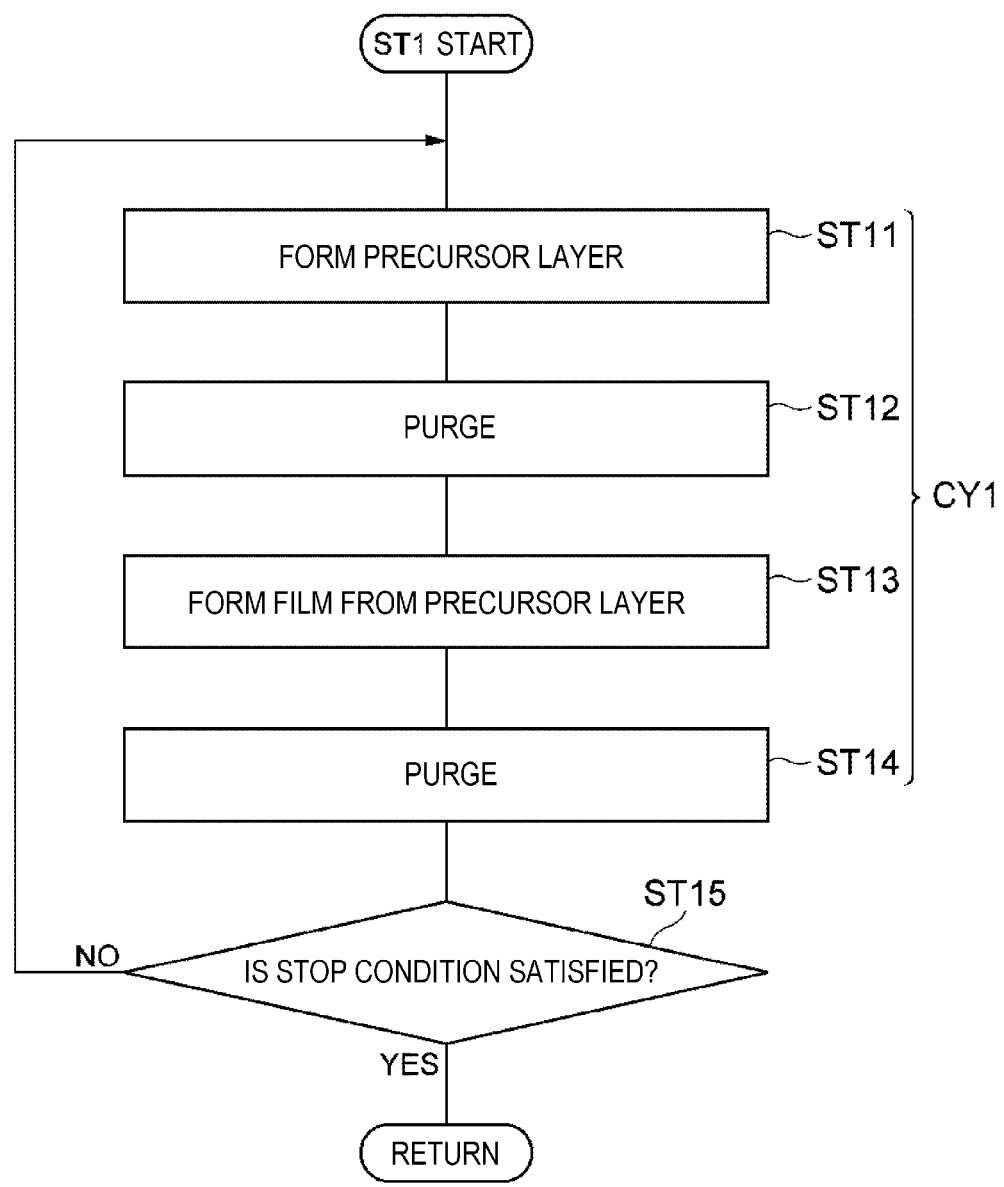
FIG. 5 is a flowchart of a film formation method which may be used in the etching method according to the embodiment.

Alternatively, the film PF may be formed by a film formation method illustrated in FIG. 5 in step ST1. FIG. 5 is a flowchart of a film formation method which may be used in the etching method according to the embodiment. Hereinafter, reference will be made to FIGS. 6A and 6B together with FIG. 5. FIG. 6A is a partially enlarged cross-sectional view of the exemplary substrate after a precursor layer is formed. FIG. 6B is a partially enlarged cross-sectional view of the exemplary substrate after a film PF is formed.

In an embodiment, as illustrated in FIG. 5, step ST1 includes steps ST11 and ST13. Step ST1 may further include step ST12 and step ST14. Step ST12 is performed between step ST11 and step ST13. Step ST14 is performed between step ST13 and step ST11.

In step ST11, as illustrated in FIG. 6A, a precursor layer PC is formed on the surface of the substrate W. In step ST11, a first gas is used for forming the precursor layer PC. The first gas contains a material constituting the precursor PC. In step ST11, the precursor layer PC may be formed without generating plasma from the first gas. Alternatively, in step ST11, the precursor layer PC may be formed using chemical species from the plasma generated from the first gas.

In step ST11, the controller 80 controls the gas supply GS to supply the first gas into the chamber 10. In step ST11, the controller 80 controls the exhaust device 50 to set the pressure of the gas in the chamber 10 to a designated pressure. When plasma is generated in step ST11, the controller 80 controls the plasma generator to generate plasma from the first gas in the chamber 10. In an embodiment, the controller 80 controls the radio-frequency power supply 61 and/or the bias power supply 62 to supply the radio-frequency power HF and/or the radio-frequency power LF.

In order to form the precursor PC illustrated in FIG. 6A, at least one of the conditions (1) to (5) is satisfied in step ST11. Under the condition (1), the pressure of the gas in the chamber 10 during the performance of step ST11 is set to be lower than the pressure at which the substance forming the precursor layer PC is adsorbed on the entire surface of the substrate W, when the other processing conditions are the same. Under the condition (2), the processing time of step ST11 is set to be shorter than the processing time in which the substance forming the precursor layer PC is adsorbed on the entire surface of the substrate W, when the other processing conditions are the same. Under the condition (3), the dilution of the substance forming the precursor layer PC in the first gas is set to a value higher than the dilution of the substance forming the precursor layer PC adsorbed on the entire surface of the substrate W, when the other processing conditions are the same. Under the condition (4), the temperature of the substrate supporter 16 during the performance of step ST11 is set to a temperature lower than the temperature at which the substance forming the precursor layer PC is adsorbed on the entire surface of the substrate W, when the other processing conditions are the same. The condition (5) may be applied when plasma is generated in step ST11. Under the condition (5), the absolute value of the radio-frequency power (radio-frequency power HF and/or radio-frequency power LF) is set to a value smaller than the absolute value in which the substance forming the precursor layer PC is adsorbed on the entire surface of the substrate W, when the other processing conditions are the same.

In step ST12, purging of the internal space 10s is performed. In step ST12, the controller 80 controls the exhaust device 50 to exhaust the internal space 10s. In step ST12, the controller 80 controls the gas supply GS to supply the inert gas into the chamber 10. By performing step ST12, the first gas in the chamber 10 may be replaced with an inert gas. By performing step ST12, excess substances adsorbed on the substrate W may be removed.

In step ST13, as illustrated in FIG. 6B, a film PF is formed from the precursor layer PC. In step ST13, a second gas is used for forming the film PF. The second gas contains reaction species that react with a substance constituting the precursor layer PC to form the film PF from the precursor layer PC. The second gas may include an oxygen-containing gas. The second gas includes, for example, oxygen gas. In step ST13, the film PF may be formed without generating plasma from the second gas. Alternatively, in step ST13, the film PF may be formed using chemical species from the plasma generated from the second gas.

In step ST13, the controller 80 controls the gas supply GS to supply the second gas into the chamber 10. In step ST13, the controller 80 controls the exhaust device 50 to set the pressure of the gas in the chamber 10 to a designated pressure. When plasma is generated in step ST13, the controller 80 controls the plasma generator to generate plasma from the second gas in the chamber 10. In an embodiment, the controller 80 controls the radio-frequency power supply 61 and/or the bias power supply 62 to supply the radio-frequency power HF and/or the radio-frequency power LF.

In order to form the film PF illustrated in FIG. 6B, at least one of the conditions (1) to (5) may be satisfied in step ST13. Under the condition (1), the pressure of the gas in the chamber 10 during the performance of step ST13 is set to be lower than the pressure at which the reaction between the substance in the second gas and the substance forming the precursor layer PC is completed in the entire precursor layer PC, when the other processing conditions are the same. Under the condition (2), the processing time of step ST13 is set to be shorter than the processing time in which the reaction between the substance in the second gas and the substance forming the precursor layer PC is completed in the entire precursor layer PC, when the other processing conditions are the same. Under the condition (3), the dilution of the substance forming the film PF in the second gas is set to a value higher than the dilution at which the reaction between the substance in the second gas and the substance forming the precursor layer PC is completed in the entire precursor layer PC, when the other processing conditions are the same. Under the condition (4), the temperature of the substrate supporter 16 during the performance of step ST13 is set to a temperature lower than the temperature at which the reaction between the substance in the second gas and the substance forming the precursor layer PC is completed in the entire precursor layer PC, when the other processing conditions are the same. The condition (5) may be applied when plasma is generated in step ST13. Under the condition (5), the absolute value of the radio-frequency power (radio-frequency power HF and/or radio-frequency power LF) is set to a value smaller than the absolute value in which the reaction between the substance in the second gas and the substance forming the precursor layer PC is completed in the entire precursor layer PC, when the other processing conditions are the same.

In step ST14, purging of the internal space 10s is performed. Step ST14 is the same step as step ST12. By performing step ST14, the second gas in the chamber 10 may be replaced with an inert gas.

In step ST1, a plurality of film forming cycles CY1 each including step ST11 and step ST13 may be repeated in order. Each of the plurality of film forming cycles CY1 may further include step ST12 and step ST14. The thickness of the film PF may be adjusted by the number of repetitions of the film forming cycle CY1. When the film forming cycle CY1 is repeated, it is determined in step ST15 whether or not a stop condition is satisfied. The stop condition is satisfied when the number of performance of the film forming cycle CY1 has reached a predetermined number. When it is determined in step ST15 that the stop condition is not satisfied, the film forming cycle CY1 is performed again. When it is determined in step ST15 that the stop condition is satisfied, the performance of step ST1 ends, and the process proceeds to step ST2 as illustrated in FIG. 1.

Step ST2 is performed after the film PF is formed on the substrate W in step ST1. In step ST2, the region RE is etched. In an embodiment, the region RE is etched by chemical species from the plasma. In step ST2, plasma P2 is generated from a processing gas in the chamber 10.

The processing gas used in step ST2 contains a fluorocarbon gas when the region RE is made of a single silicon oxide film. When the substrate W of any one of the second to fourth examples is processed, the processing gas used in step ST2 may contain fluorocarbon gas and/or hydrofluorocarbon gas. In any case where the substrate W of any example is processed, the processing gas used in step ST2 may further contain an inert gas (e.g., a rare gas).

Figure 7A:
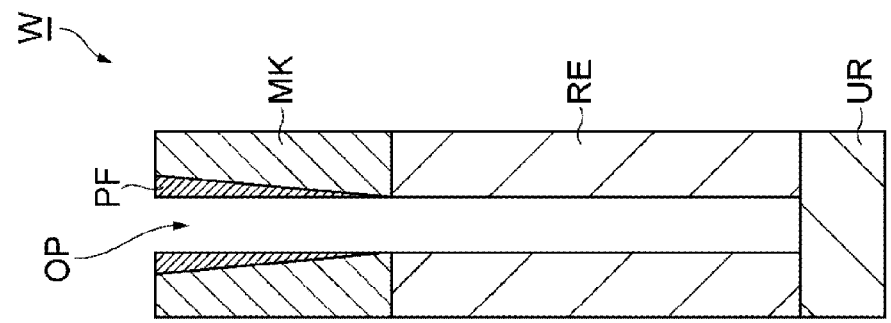
FIG. 7A is a view for explaining step ST2 of the etching method illustrated in FIG. 1.
Figure 7B:
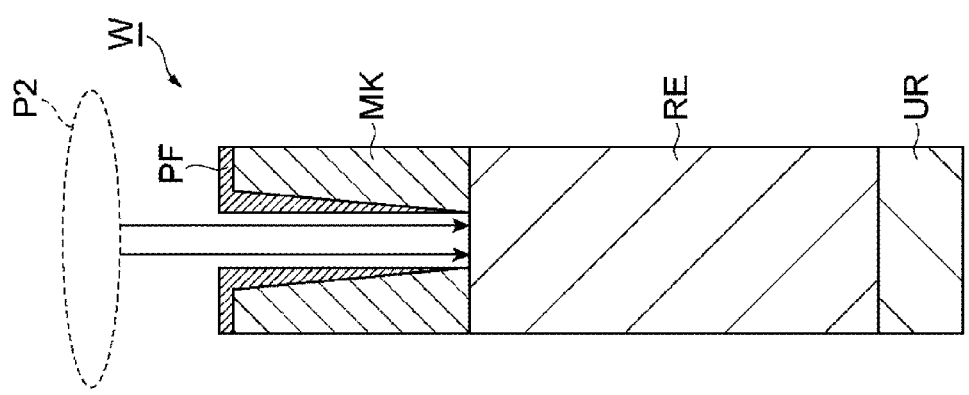
FIG. 7B is a partially enlarged cross-sectional view of the exemplary substrate after step ST2 is performed.

FIG. 7A is a view for explaining step ST2 of the etching method illustrated in FIG. 1, and FIG. 7B is a partially enlarged cross-sectional view of the exemplary substrate after step ST2 is performed. In step ST2, as illustrated in FIG. 7A, chemical species from the plasma P2 are irradiated to the region RE, so that the region RE is etched by the chemical species. As a result of the performance of step ST2, as illustrated in FIG. 7B, the depth of the opening OP is increased. The opening OP formed in the region RE may have an aspect ratio of 10 or more.

In step ST2, the controller 80 controls the exhaust device 50 to set the pressure of the gas in the chamber 10 to a designated pressure. In step ST2, the controller 80 controls the gas supply GS to supply the processing gas into the chamber 10. In step ST2, the controller 80 controls the plasma generator to generate plasma from the processing gas. In step ST2 in an embodiment, the controller 80 controls the radio-frequency power supply 61 and the bias power supply 62 to supply the radio-frequency power HF and the bias power BP. In step ST2, only one of the radio-frequency power HF and the radio-frequency power LF may be supplied to generate the plasma.

In the method MT, a plurality of cycles CY each including step ST1 and step ST2 may be repeated in order. When the plurality of cycles CY are performed in order, it is determined in step ST3 whether or not the stop condition is satisfied. The stop condition is satisfied when the number of performance of the cycle CY has reached a predetermined number. When it is determined in step ST3 that the stop condition is not satisfied, the cycle CY is performed again. When it is determined in step ST3 that the stop condition is satisfied, the performance of the method MT ends.

In the method MT, the film PF formed on the substrate W protects the mask MK at the start of etching of the region RE. Therefore, according to the method MT, the selectivity of the etching of the region RE to the etching of the mask MK may be enhanced. Further, since the shape of the mask is corrected by the film PF, the verticality of the opening formed in the region RE by etching is enhanced.

The condition of step ST1 for forming the film PF in at least one of the plurality of cycles CY may be different from the condition of step ST1 for forming the film PF in at least one other cycle of the plurality of cycles CY. The conditions of step ST1 for all cycles CY may be different from each other. In this case, the film PF may be formed in each cycle such that its thickness or coverage is different from the thickness or coverage of the film PF formed in other cycles.

The condition of step ST2 for etching the region RE in at least one of the plurality of cycles CY may be different from the condition of step ST2 for etching the region RE in at least one other cycle of the plurality of cycles CY. The conditions of step ST2 for all cycles CY may be different from each other. In this case, the region RE may be etched in each cycle such that its etching amount is different from the etching amount of the region RE in other cycles.

In each of the plurality of cycles CY, the condition for forming the film PF in one of the plurality of film forming cycles CY1 may be different from the condition for forming the film PF in at least one other film forming cycle of the plurality of film forming cycles CY1. That is, in each of the plurality of cycles CY, the condition of step ST11 and/or the condition of step ST13 in one film forming cycle may be different from the condition of step ST11 and/or the condition of step ST13 in at least one other film forming cycle. In each of the plurality of cycles CY, the conditions for forming the film PF in all the film forming cycles CY1 may be different from each other. In this case, the thickness distribution of the film PF may be controlled by each of the plurality of film forming cycles CY1 included in each of the plurality of cycles CY.

Figure 8:
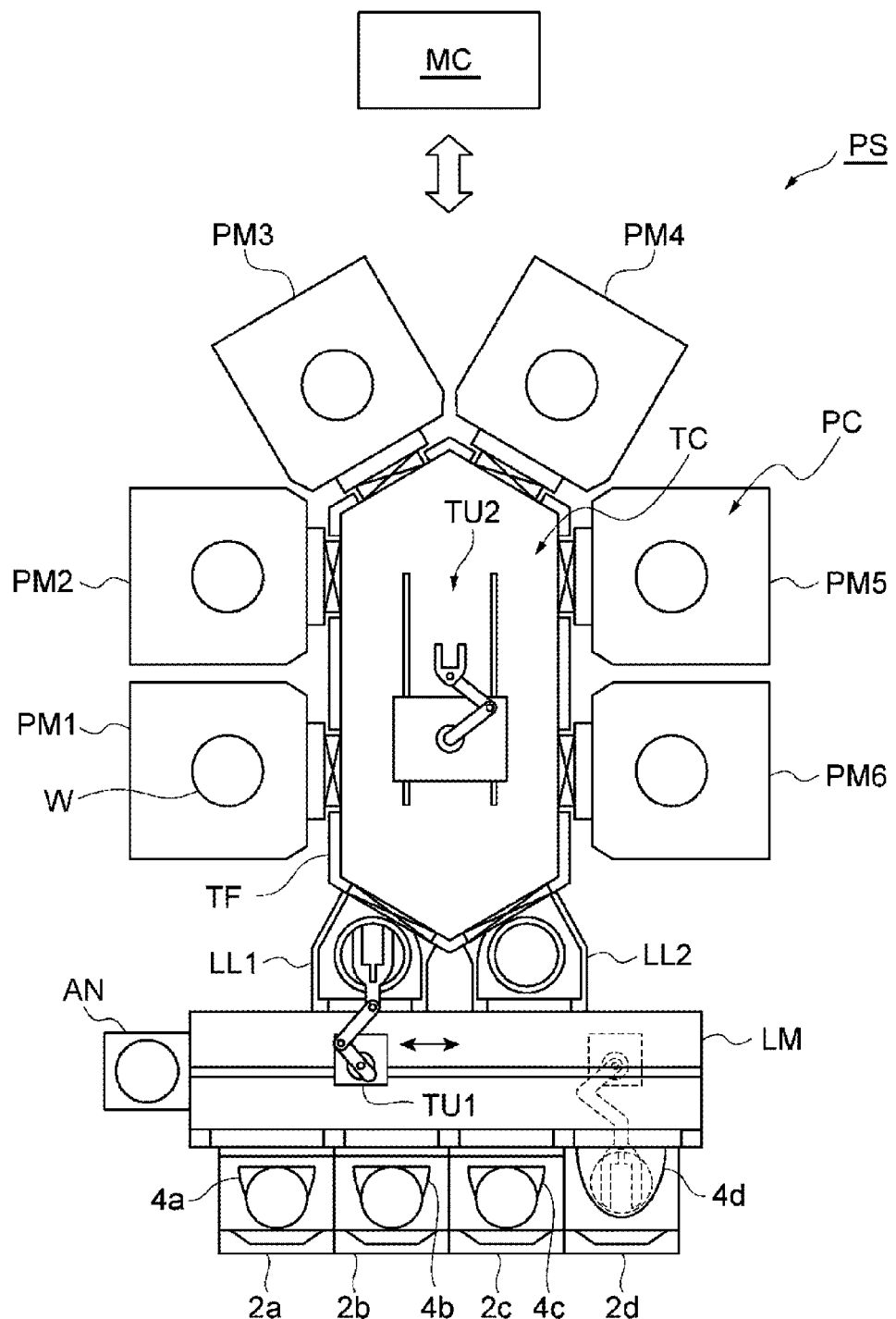
FIG. 8 is a view illustrating a substrate processing system according to an embodiment.

Hereinafter, reference will be made to FIG. 8. The method MT may be performed using a substrate processing system that includes a film forming apparatus and a substrate processing apparatus. FIG. 8 is a view illustrating a substrate processing system according to an embodiment. The substrate processing system PS illustrated in FIG. 8 may be used to perform the method MT.

The substrate processing system PS includes bases 2a to 2d, containers 4a to 4d, a loader module LM, an aligner AN, load lock modules LL1 and LL2, process modules PM1 to PM6, a transfer module TF, and a controller MC. The number of bases, the number of containers, and the number of load lock modules in the substrate processing system PS may be any number of one or more. In addition, the number of process modules in the substrate processing system PS may be any number of two or more.

The bases 2a to 2d are arranged along one edge of the loader module LM. The containers 4a to 4d are mounted on the bases 2a to 2d, respectively. Each of the containers 4a to 4d is, for example, a container called FOUP (front opening unified pod). Each of the containers 4a to 4d is configured to accommodate the substrate W therein.

The loader module LM includes a chamber. The pressure in the chamber of the loader module LM is set to an atmospheric pressure. The loader module LM includes a transfer device TU1. The transfer device TU1 is, for example, an articulated robot and is controlled by the controller MC. The transfer device TU1 is configured to transfer the substrate W through the chamber of the loader module LM. The transfer device TU1 may transfer the substrate W between each of the containers 4a to 4d and the aligner AN, between the aligner AN and each of the load lock modules LL1 and LL2, between each of the load lock modules LL1 and LL2 and each of the containers 4a to 4d. The aligner AN is connected to the loader module LM. The aligner AN is configured to adjust (calibrate) the position of the substrate W.

Each of the load lock modules LL1 and LL2 is provided between the loader module LM and the transfer module TF. Each of the load lock modules LL1 and LL2 provides a preliminary decompression chamber.

The transfer module TF is connected to each of the load lock modules LL1 and LL2 via a gate valve. The transfer module TF includes a pressure-reducible transfer chamber TC. The transfer module TF includes a transfer device TU2. The transfer device TU2 is, for example, an articulated robot and is controlled by the controller MC. The transfer device TU2 is configured to transfer the substrate W through the transfer chamber TC. The transport device TU2 may transfer the substrate W between each of the load lock modules LL1 and LL2 and each of the process modules PM1 to PM6, and between any two process modules of the process modules PM1 to PM6.

Each of the process modules PM1 to PM6 is an apparatus configured to perform a dedicated substrate processing. One of the process modules PM1 to PM6 is a film forming apparatus. The film forming apparatus is used to form the film PF in step ST1. Therefore, this film forming apparatus is an apparatus configured to perform step ST1 by the above-mentioned film forming method. This film forming apparatus may be a plasma processing apparatus such as the plasma processing apparatus 1 or another plasma processing apparatus when plasma is generated in step ST1. When the film PF is formed without generating plasma in step ST1, the film forming apparatus does not have to have a configuration for generating plasma.

Another process module among the process modules PM1 to PM6 is a substrate processing apparatus such as a plasma processing apparatus 1 or another plasma processing apparatus. The substrate processing apparatus is used to etch the region RE in step ST2.

In the substrate processing system PS, the controller MC is configured to control each unit of the substrate processing system PS. The controller MC controls the film forming apparatus to form the film PF in step ST1. The controller MC controls the substrate processing apparatus to etch the region RE after the film PF is formed. The substrate processing system PS may transfer the substrate W between the process modules without bringing the substrate W into contact with the atmosphere.

Although various embodiments have been described above, the present disclosure is not limited to the embodiments described above, and various omissions, substitutions, and modifications may be made. Further, it is possible to combine the elements in different embodiments to form other embodiments.

For example, the substrate processing apparatus used to perform the method MT may be any type of plasma processing apparatus. For example, the substrate processing apparatus used to perform the method MT may be a capacitively coupled plasma processing apparatus other than the plasma processing apparatus 1. The substrate processing apparatus used to perform the method MT may be an inductively coupled plasma processing apparatus, an electron cyclotron resonance (ECR) plasma processing apparatus, or a plasma processing apparatus that uses a surface wave such as a microwave for plasma generation. Further, in the method MT, the substrate processing apparatus may not have a plasma generator when plasma is not used.

According to an embodiment, it is possible to increase the etching selectivity of the region in the substrate with respect to the etching of the mask, thereby enhancing the verticality of the opening formed in the region.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
   forming a film on a surface of a substrate having a region at least partially made of silicon oxide and a mask provided on the region, the mask including an opening that partially exposes the region and the film being made of a same material as that of the region; and
   after the forming the film, etching the region,
   wherein the forming the film includes supplying a first gas to the substrate thereby forming a precursor layer on the substrate, and supplying a second gas to the precursor layer thereby forming the film from the precursor layer, wherein the precursor layer is formed with one of (1)-(5) conditions as indicated below,
   wherein the film is configured such that a thickness thereof decreases from an upper end of the substrate along a depth direction of the opening of the mask and the region of the substrate is exposed at a bottom portion of the opening,
   wherein, in the etching, the film corrects a shape of the mask to enhance a verticality of the opening formed in the region, and
   wherein the (1)-(5) conditions are as follows:
   (1) a pressure in the chamber during forming the precursor with the first gas is set to be less than a pressure at which a substance forming the precursor is adsorbed on an entire surface of the substrate,
   (2) a processing time of forming the precursor with the first gas is set to be shorter than a process time in which the substance forming the precursor is adsorbed on the entire surface of the substrate,
   (3) a dilution rate of the substance forming the precursor with the first gas is set to be lower than a dilution rate at which the substance forming the precursor layer is formed on the entire surface of the substrate,
   (4) a temperature of a substrate support in the chamber is set to be lower than a temperature at which the substance forming the precursor with the first gas is adsorbed on the entire surface of the substrate, and
   (5) an absolute value of a radio-frequency power is set to be smaller than an absolute value of the radio-frequency power at which the substance forming the precursor layer is adsorbed on the entire surface of the substrate.

2. The etching method according to claim 1, wherein the forming the film and the etching the region are alternately repeated.

3. The etching method according to claim 2, wherein the region includes a silicon oxide film.

4. The etching method according to claim 2, wherein the region includes one or more silicon oxide films and one or more silicon nitride films that are alternately stacked.

5. The etching method according to claim 2, wherein the region includes one or more silicon oxide films and one or more polycrystalline silicon films that are alternately stacked.

6. The etching method according to claim 2, wherein the region includes one or more silicon oxide films, one or more silicon nitride films, and one or more polycrystalline silicon films that are stacked.

7. The etching method according to claim 6, wherein the mask is made of silicon, a carbon-containing material, or metal-containing material.

8. The etching method according to claim 2, wherein the second gas includes an oxygen-containing gas.

9. The etching method according to claim 1, wherein the region includes a silicon oxide film.

10. The etching method according to claim 1, wherein the region includes one or more silicon oxide films and one or more silicon nitride films that are alternately stacked.

11. The etching method according to claim 1, wherein the region includes one or more silicon oxide films and one or more polycrystalline silicon films that are alternately stacked.

12. The etching method according to claim 1, wherein the region includes one or more silicon oxide films, one or more silicon nitride films, and one or more polycrystalline silicon films that are stacked.

13. The etching method according to claim 1, wherein the mask is made of silicon, a carbon-containing material, or metal-containing material.

14. The etching method according to claim 1, wherein the etching the region uses a processing gas that includes at least one selected from the group consisting of fluorocarbon gas and hydrofluorocarbon gas.

15. The etching method according to claim 1, wherein after forming of the film and prior to the etching, the film has a tapered shape from a top of the opening of the mask to a bottom of the mask such that the film has a thickness larger at the top of the opening than at the bottom of the mask.

16. An etching method comprising:
   forming a film of silicon oxide on a surface of a substrate having an alternating stack of silicon oxide and silicon nitride, and a carbon mask on the stack, the mask including an opening that exposes the stack; and
   after the forming the film, etching the stack,
   wherein the forming the film includes supplying an amino silane gas to the substrate thereby forming a precursor layer on the substrate, and supplying an oxygen containing gas to the precursor layer under one of (1)-(5) conditions as indicated below thereby forming the film from the precursor layer,
   wherein the forming the film and the etching the stack are repeated such that a thickness of the film decreases from an upper end of the substrate along a depth direction of the opening of the mask and the stack is exposed at a bottom portion of the opening, and
   wherein the (1)-(5) conditions are as follows:
   (1) a gas pressure of a chamber is set to be lower than a pressure at which a reaction between the oxygen containing gas and the precursor layer is completed over an entire precursor layer,
   (2) a processing time during which the film is formed from the precursor layer is set to be shorter than a processing time during which a reaction between the oxygen containing gas and the precursor layer is completed over the entire precursor layer,
   (3) a dilution rate of the oxygen containing gas that forms the film is set to be lower than a dilution rate at which a reaction between the oxygen containing gas and the precursor layer is completed over an entire precursor layer,
   (4) a temperature of a substrate support in the chamber is set to be lower than a temperature at which a reaction between the oxygen containing gas and the precursor layer is completed over an entire precursor layer, and
   (5) an absolute value of a radio-frequency power supplied to the chamber is set to be smaller than an absolute value of the radio-frequency power at which a reaction between the oxygen containing gas and the precursor layer is completed over an entire precursor layer.

17. The etching method according to claim 16, wherein the forming the film and the etching the stack are alternately repeated.

18. The etching method according to claim 16, wherein the etching the stack uses a processing gas that includes at least one selected from the group consisting of fluorocarbon gas and hydrofluorocarbon gas.

19. The etching method according to claim 16, wherein after forming of the film and prior to the etching, the film has a tapered shape from a top of the opening of the mask to a bottom of the mask such that the film has a thickness larger at the top of the opening than at the bottom of the mask.

* * * * *